(12) United States Patent
Sanpei et al.

(10) Patent No.: US 8,446,082 B2
(45) Date of Patent: May 21, 2013

(54) LIGHT-EMITTING DEVICE AND ILLUMINATION DEVICE

(75) Inventors: Tomohiro Sanpei, Yokosuka (JP); Erika Takenaka, Yokosuka (JP)

(73) Assignee: Toshiba Lighting & Technology Corporation, Kanagawa (JP)

( * ) Notice: Subject to any disclaimer, the term of this patent is extended or adjusted under 35 U.S.C. 154(b) by 0 days.

(21) Appl. No.: 13/049,571

(22) Filed: Mar. 16, 2011

(65) Prior Publication Data

US 2011/0234080 A1 Sep. 29, 2011

(30) Foreign Application Priority Data

Mar. 25, 2010 (JP) ................................. 2010-070542

(51) Int. Cl.
*H01L 33/48* (2010.01)
*H01L 33/60* (2010.01)

(52) U.S. Cl.
USPC ............. 313/113; 313/498; 313/512; 257/99

(58) Field of Classification Search
USPC ...... 313/498, 512, 113; 362/800, 247; 257/99
See application file for complete search history.

(56) References Cited

U.S. PATENT DOCUMENTS

| 6,914,267 | B2 * | 7/2005 | Fukasawa et al. .............. 257/98 |
| 7,800,124 | B2 * | 9/2010 | Urano et al. ..................... 257/98 |
| 2003/0080341 | A1 | 5/2003 | Sakano |
| 2005/0224821 | A1 | 10/2005 | Sakano |
| 2008/0099727 | A1 | 5/2008 | Sakano |
| 2009/0026485 | A1 | 1/2009 | Urano |
| 2010/0230696 | A1 | 9/2010 | Fukunaga |
| 2010/0301373 | A1 | 12/2010 | Urano |
| 2010/0301725 | A1 * | 12/2010 | Matsui et al. ................... 313/45 |
| 2010/0301731 | A1 * | 12/2010 | Morikawa et al. ............ 313/113 |
| 2010/0314654 | A1 | 12/2010 | Hayashi |
| 2011/0068674 | A1 * | 3/2011 | Takenaka et al. ........ 313/318.07 |

FOREIGN PATENT DOCUMENTS

| EP | 2109157 | 10/2009 |
| JP | 2007-138017 | 6/2007 |
| JP | 2007-235085 | 9/2007 |
| JP | 2008-001880 | 1/2008 |
| JP | 2008-251664 | 10/2008 |
| JP | 2008-277561 | 11/2008 |
| JP | 2009/065137 | 3/2009 |
| WO | WO 2009/028156 | 5/2009 |

OTHER PUBLICATIONS

English Language Abstract of JP 2008-277561 published on Nov. 13, 2008.

(Continued)

*Primary Examiner* — Karabi Guharay
(74) *Attorney, Agent, or Firm* — DLA Piper LLP (US)

(57) ABSTRACT

According to one embodiment, a light-emitting device includes a substrate, a light reflection layer, a plurality of light-emitting elements, and a sealing member. The substrate includes an insulating layer constituted of epoxy resin using an acid anhydride as a hardening agent or one of a polyimide resin, a polyethylene terephthalate resin, and a fluororesin. The light reflection layer is formed on the insulating layer. The light reflection layer includes a metallic light-reflecting surface higher in optical reflectance than the insulating layer. The light-emitting elements are mounted on the light-reflecting surface. The sealing member is constituted of a material having gas permeability and translucency, and is formed on the insulating layer to seal the light reflection layer and the light-emitting elements.

4 Claims, 5 Drawing Sheets

OTHER PUBLICATIONS

English Language Translation of JP 2008-277561 published on Nov. 13, 2008.
European Search Report mailed Feb. 20, 2013 in EP 11158451.2.
English Language Abstract of JP 2008-001880 published Jan. 10, 2008.
English Language Translation of JP 2008-001880 published Jan. 10, 2008.
English Language Abstract of Jp2007-235085 published Sep. 13, 2007.
English Language Translation of Jp2007-235085 published Sep. 13, 2007.
English Language Abstract of JP 2007-138017 published Jun. 7, 2007.
English Language Translation of JP 2007-138017 published Jun. 7, 2007.
English Language Abstract of JP 2009-065137 published Mar. 26, 2009.
English Language Translation of JP 2009-065137 published Mar. 26, 2009.
English Language Abstract of JP 2008-251664 published Oct. 16, 2008.
English Language Translation of JP 2008-251664 published Oct. 16, 2008.

* cited by examiner

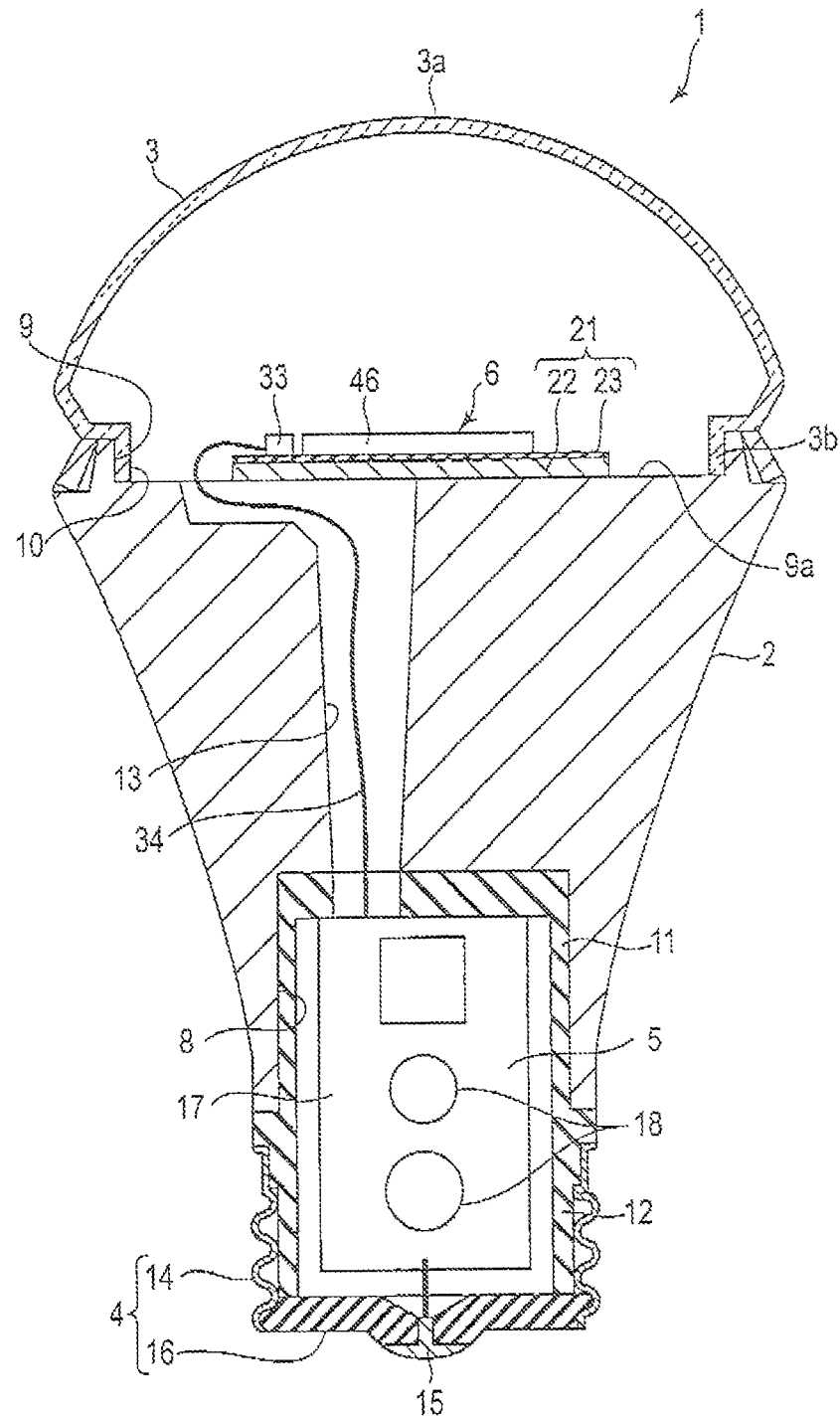
F I G. 2

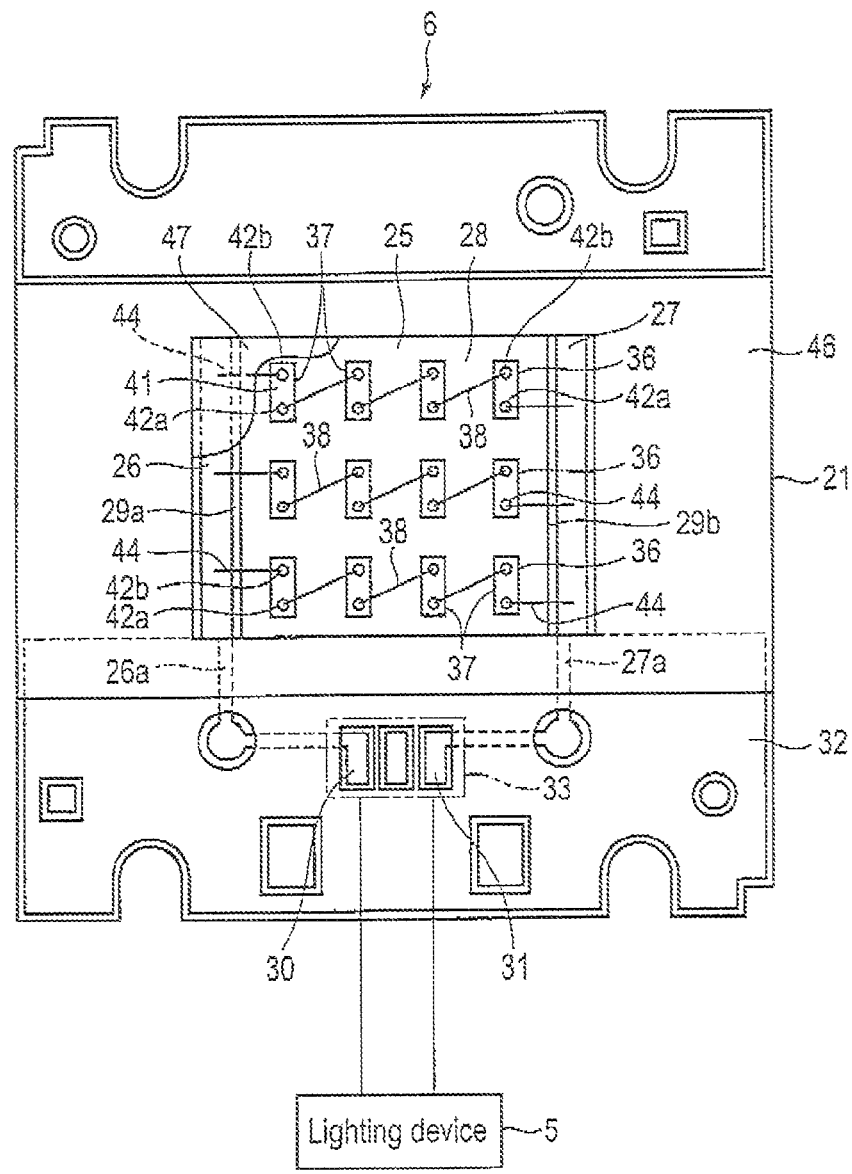
F I G. 3

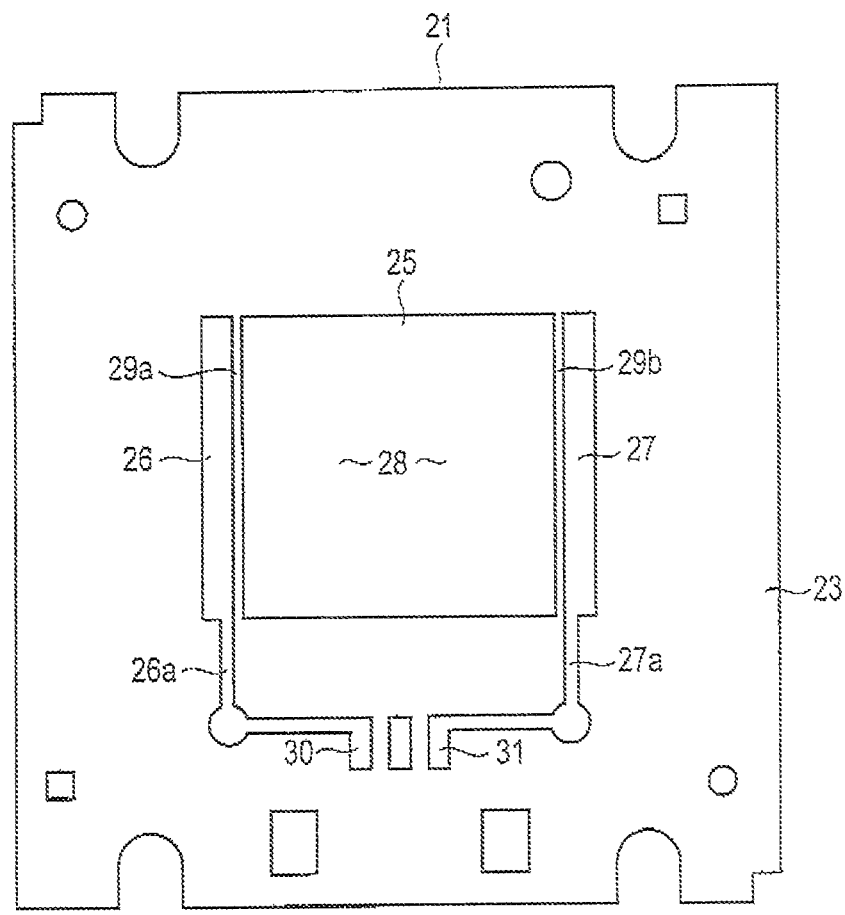
F I G. 4

LIGHT-EMITTING DEVICE AND ILLUMINATION DEVICE

CROSS-REFERENCE TO RELATED APPLICATIONS

This application is based upon and claims the benefit of priority from Japanese Patent Application No. 2010-070542, filed Mar. 25, 2010; the entire contents of which are incorporated herein by reference.

FIELD

Embodiments described herein relate generally to a light-emitting device including a plurality of light-emitting diodes connected in series, and illumination device in which the light-emitting device is used as a light source.

BACKGROUND

A light-emitting device of a chip-on-board (COB) type is used as a light source of an illumination device such as an LED lamp. A light-emitting device disclosed in Jpn. Pat. Appln. KOKAI Publication No. 2008-277561 is provided with a substrate, a plurality of light-emitting diode columns, reflector, and sealing member.

The substrate includes a mount surface on which a plurality of power-supply conductors are arranged. The light-emitting diode columns linearly extend along the mount surface of the substrate, and are arranged at intervals in a direction perpendicular to a direction in which the light-emitting diode columns extend.

Each of the light-emitting diode columns is provided with a plurality of light-emitting diode chips configured to emit blue light. The light-emitting diode chips are arranged at intervals in a line. Each of the light-emitting diode chips includes a positive electrode, and negative electrode, and is joined to the mount surface of the substrate with a transparent adhesive.

Light-emitting diode chips adjacent to each other in the direction in which the light-emitting diode column extends are electrically connected to each other through a first bonding wire. An end of the first bonding wire is connected to a positive electrode of one of adjacent light-emitting diode chips. The other end of the first bonding wire is connected to a negative electrode of the other light-emitting diode chip. Accordingly, the plurality of light-emitting diode chips constituting a light-emitting diode column are connected in series. Furthermore, each of light-emitting diode chips positioned at both ends of a light-emitting diode column is electrically connected to a power-supply conductor of the substrate through a second bonding wire.

The reflector is joined to the mount surface of the substrate to surround the light-emitting diode columns. The sealing member is constituted of a transparent silicon resin mixed with a yellow fluorescent material. The sealing member is filled into an area surrounded by the reflector, and seals the light-emitting diode columns on the mount surface.

According to such a light-emitting device, the light-emitting diode chips emit light all at once by energization. The blue light emitted from the light-emitting diode chips is made incident on the sealing member. Thereby, the yellow fluorescent material is excited to emit yellow light, which is a complementary color of blue. The yellow light and blue light are mixed with each other to produce white light, and the white light is used for the illumination purpose.

According to the light-emitting device disclosed in the aforementioned Jpn. Pat. Appln. KOKAI Publication No. 2008-277561, the substrate is constituted of white epoxy resin in order that the light emitted from the light-emitting diode chips may be efficiently extracted. In order to obtain a white substrate, normally powder of titanium oxide is mixed into the epoxy resin.

However, titanium oxide is liable to be decomposed by blue light when blue light emitted from the light-emitting diode chips is made incident on the sealing member. Accordingly, the mount surface of the substrate is gradually deteriorated to be brought into a roughened state. Accordingly, it becomes difficult to maintain the light reflection performance required of the white mount surface for a long period.

As a countermeasure against the above, it has been conventionally tried to form a plurality of metallic light reflection layers on the mount surface of the substrate. The light reflection layers are used to reflect light emitted from the light-emitting diode chips in the direction toward the substrate in a direction in which light should be extracted. The light reflection layers are arranged at intervals so that they may correspond to positions of the light-emitting diode chips. In other words, a plurality of light-emitting diode chips are individually mounted on the light reflection layer.

However, it has been made clear even in the light-emitting device using the light reflection layers that there is the following problem to be solved. That is, the light reflection layers are arranged at intervals on the mount surface of the substrate, and hence the mount surface formed of the epoxy resin is exposed at parts between adjacent light reflection layers. Accordingly, it is inevitable that light emitted from the light-emitting diode chips is shined into the mount surface at parts between adjacent light reflection layers. When the epoxy resin receives light emitted from the light-emitting diode chips, part of the resin components (organic substance) constituting the skeleton of the epoxy resin are decomposed by the light to be gasified. It is conceivable that this phenomenon is caused by decomposition of uncombined molecules contained in the epoxy resin by the light.

Furthermore, the light reflection layers are covered with the sealing member together with the light-emitting diode chips. The silicon resin constituting the sealing member has permeability to gas. Accordingly, it cannot be denied that a gas released from the epoxy resin constituting the substrate passes through the sealing member to reach the light reflection layers.

When the surface of the light reflection layer receiving heat of the light-emitting diode chips is exposed to the gas, the light reflection layer reacts with the gas, and the surface of the light reflection layer is discolored to be darkened. It has been made clear that such a phenomenon is conspicuous when the surface of the light reflection layer is constituted of silver. The phenomenon in which the surface of the light reflection layer is discolored to be darkened lasts until the release of the gas stops.

When the surface of the light reflection layer is discolored dark, the light reflection performance of the light reflection layer is deteriorated. Accordingly, although the light reflection layers are provided on the mount surface of the substrate, it becomes impossible to efficiently extract light. As a result, it becomes difficult to maintain the expected luminous flux required of the light-emitting device for a long period.

From the above description, in the light-emitting device in the current state, there is yet room for improvement from the viewpoint of efficiently extracting light emitted from the light-emitting diode chips, and maintaining the desired luminous flux for a long time.

BRIEF DESCRIPTION OF THE DRAWINGS

FIG. 2 is a cross-sectional view of the LED lamp according to the embodiment;

FIG. 3 is a plan view of a light-emitting device serving as a light source of the LED lamp;

FIG. 4 is a plan view of a substrate provided in the light-emitting device of FIG. 3.

DETAILED DESCRIPTION

Figure 1:
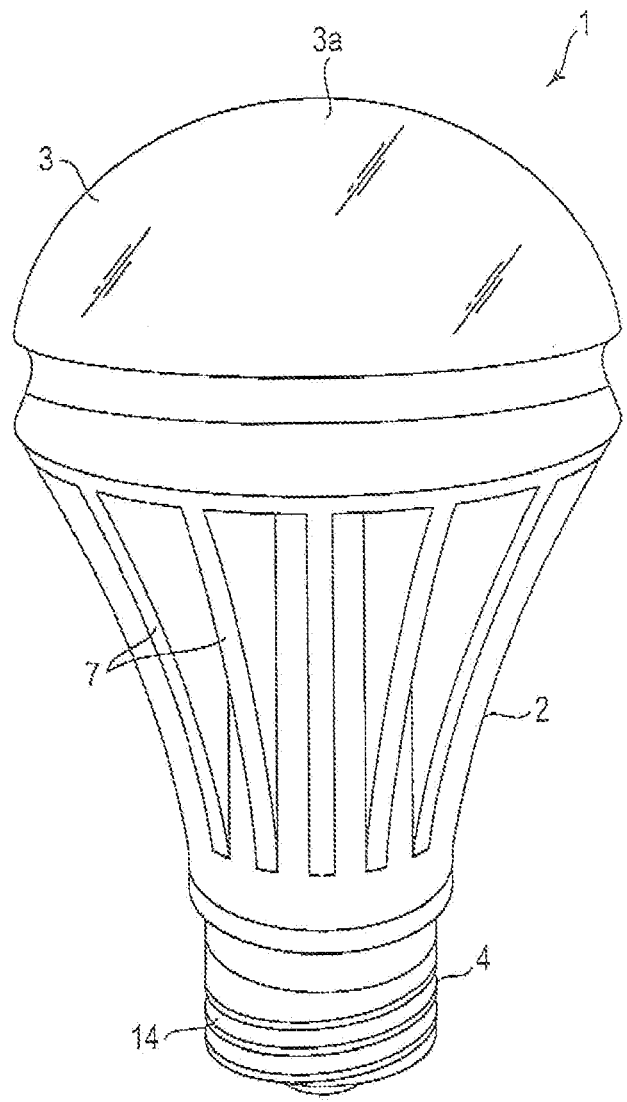
FIG. 1 is a perspective view of an LED lamp according to an embodiment.

In general, according to one embodiment, a light-emitting device is provided with a substrate, light reflection layer, a plurality of light-emitting elements, and sealing member. The substrate includes an insulating layer constituted of epoxy resin using an acid anhydride as a hardening agent. The light reflection layer is formed on the insulating layer. The light reflection layer has a metallic light-reflecting surface with higher optical reflectance than the insulating layer. The light-emitting elements are mounted on the light-reflecting surface. The sealing member is constituted of a material having permeability and translucency, and is formed on the insulating layer to seal the light reflection layer and light-emitting elements.

The substrate may be constituted of one insulating plate or may be formed by laminating a plurality of insulating plates. Furthermore, the substrate may have a configuration in which insulating layers are formed on a base made of a metal such as iron or aluminum. When the substrate is constituted of one insulating plate, the surface layer part of the insulating plate constitutes an insulating layer. The epoxy resin constituting the insulating layer may contain a filler such as titanium oxide or the like, and the optical reflectance of the epoxy resin may be 50% or less.

The surface layer part of the insulating plate is constituted of the epoxy resin using the acid anhydride as the hardening agent. When some other layer made of a synthetic resin is formed under the surface layer part, the other layer may be epoxy resin using an acid anhydride as a hardening agent or may be epoxy resin using some other hardening agent.

The acid anhydride to be used as the hardening agent is classified into an aliphatic series, alicyclic series, aromatic series, and halogen series. As the hardening agent of the aliphatic series, dodecenyl succinic anhydride (DDSA), and poliazelaic polyanhydride (PAPA) are representative. As the hardening agent of the alicyclic series, hexahydrophthalic anhydride (HHPA), methyltetrahydrophthalic anhydride (MTHPA), and methyl nadic anhydride (MNA) are representative. As the hardening agent of the aromatic series, trimellitic anhydride (TMA), pyromellitic anhydride (PMDA), and benzophenone tetracarboxylic acid (BTDA) are representative. As the hardening agent of the halogen series, tetrabromophthalic anhydride (TBPA), and het anhydride (HET) are representative.

Although it is desirable that the metal constituting the light-reflecting surface be silver (Ag), the metal is not particularly limited to silver. When the light-reflecting surface is constituted of silver, it is advisable to form the light-reflecting surface by electroless plating. The light reflection layer may have a size such that one light-emitting element can be mounted, and may be provided for each light-emitting element or may have a size such that a plurality of light-emitting elements can be mounted.

As the light-emitting element, a semiconductor light-emitting element such as a light-emitting diode constituted of a bare chip, and electroluminescent element can be used. Particularly, it is desirable that a light-emitting element of a so-called single side electrode arrangement type in which a positive electrode and negative electrode are arranged on the luminous layer be used. Furthermore, as the light-emitting element, a light-emitting diode chip configured to emit blue light is suitable.

Light-emitting elements adjacent to each other are electrically connected to each other through a plurality of bonding wires. As the bonding wire, although it is desirable, in order to secure joinability to the positive electrode and negative electrode of the light-emitting element, and power-supply conductor provided on the substrate, that, for example, a thin wire of gold (Au) be used, a thin wire of a metal other than gold may also be used.

When each of a plurality of light reflection layers are provided for each light-emitting element, the light-emitting element and a light reflection layer adjacent to the light-emitting element are connected to each other by a bonding wire, whereby it is possible to connect a plurality of light-emitting elements in series. Furthermore, by directly connecting adjacent light-emitting elements to each other by using bonding wires, it is also possible to connect a plurality of light-emitting elements in series.

As the material constituting the sealing member, it is possible to use, for example, a transparent silicon resin. The sealing member may contain therein a fluorescent material in order to obtain light of a desired color, or may not contain it. For example, in order to obtain white light by using a light-emitting element configured to emit blue light, it is sufficient if a yellow fluorescent material which emits yellow light when excited by blue light is mixed into the sealing member.

According to one embodiment, the light reflection layer formed on the insulating layer has a light-reflecting surface, and the light-emitting element is mounted on the light-reflecting surface. Accordingly, it is possible to efficiently guide light emitted from the light-emitting element toward the substrate to the direction in which the light should originally be extracted, by causing the light to be reflected from the light-reflecting surface.

On the other hand, according to one embodiment, part of the insulating layer out of the light reflection layer is covered with the sealing member having gas permeability and translucency. Accordingly, light emitted from the light-emitting element is shined into the part of the insulating layer out of the light reflection layer. The insulating layer is constituted of the epoxy resin using an acid anhydride as a hardening agent, and does not contain a phenolic resin or amine resin which is an example of the hardening agent.

Incidentally, a case where the epoxy resin is singly used is rare. When epoxy resin is used, in general, the epoxy resin is reacted with a hardening agent to be made three-dimensional, and a bridged structure is formed, thereby obtaining physical properties appropriate for the application purpose. For example, as the epoxy resin used for a printed wiring board, epoxy resin of an epoxy-phenol system using phenols as the hardening agent, epoxy resin of an epoxy-amine system using a group of amines as the hardening agent, and epoxy resin of an epoxy-acid anhydride system using en acid anhydride as the hardening agent are used. Under the current circumstances, the epoxy resin of the epoxy-phenol system is frequently used as the epoxy resin for the printed wiring board.

Inventors investigated the phenomenon in which various epoxy resins are decomposed by light emitted from a blue light-emitting diode, and the phenomenon in which a metallic light reflection layer is discolored dark, and found that a specific hardening agent receives light from the blue light-emitting diode to be decomposed and gasified.

More specifically, the inventors found that, regarding the epoxy resin of the epoxy-phenol system or the epoxy resin of the epoxy-amine system, the darkening phenomenon is caused on the metallic light reflection layer due to a decomposed component of the phenolic resin or the amino-system resin which is the hardening agent of the epoxy resin. Conversely, the inventors found that, regarding the epoxy resin of the epoxy-acid anhydride system, no darkening phenomenon is caused on the metallic light reflection layer due to a decomposed component of the acid anhydride which is the hardening agent.

Accordingly, in the epoxy resin of the epoxy-acid anhydride system, although the resin components of the hardening agent are decomposed to be gasified by light emitted from the light-emitting element, the gas and metallic light reflection layer do not react with each other or even if they react with each other, the degree of reaction is negligible. Accordingly, it is possible to prevent the light-reflecting surface of the light reflection layer from being discolored dark, which lowers the optical reflectance. Thereby, the light emitting device can maintain the expected light output for a long time.

A light-emitting device according to a second embodiment is provided with a substrate, light reflection layer, a plurality of light-emitting elements, a plurality of bonding wires, and a sealing member. The substrate includes an insulating layer constituted of one of a polyimide resin, polyethylene terephthalate resin, and fluororesin. The light reflection layer is formed on the insulating layer, and includes a metallic light-reflecting surface of higher optical reflectance than the insulating layer. The light-emitting elements are mounted on the light-reflecting surface. The bonding wires electrically connect the light-emitting elements, to each other. The sealing member is constituted of a material having gas permeability and translucency, and is formed on the insulating layer to seal the light reflection layer, light-emitting elements, and bonding wires.

According to the second embodiment, the light reflection layer formed on the insulating layer includes the light-reflecting surface, and light-emitting elements are mounted on the light-reflecting surface. Accordingly, it is possible to efficiently guide light emitted from the light-emitting element toward the substrate to the direction in which the light should originally be extracted, by causing the light to be reflected from the light-reflecting surface.

On the other hand, part of the insulating layer out of the light reflection layer is covered with the sealing member having gas permeability and translucency. Accordingly, light emitted from the light-emitting element is shined into the part of the insulating layer out of the light reflection layer. The insulating layer is constituted of one of a polyimide resin, polyethylene terephthalate resin, and fluororesin, and does not contain a phenolic resin or amine resin.

Accordingly, even when the resin components of the insulating layer are decomposed and gasified by light emitted from the light-emitting element, the gas and metallic light reflection layer do not react with each other or even if they react with each other, the degree of reaction is negligible. Accordingly, it is possible to prevent the light-reflecting surface of the light reflection layer from being discolored dark, which lowers the optical reflectance. As a result, the light emitting device can maintain the expected light output for a long time.

Hereinafter, the embodiment will be described with reference to FIGS. 1 to 5.

FIG. 1 and FIG. 2 show an LED lamp 1 of the electric bulb type which is an example of the illumination device. The LED lamp 1 is provided with a lamp body 2, globe 3, E-shaped base 4, lighting device 5, and light-emitting device 6 of the chip-on-board (COB) type.

The lamp body 2 is constituted of a metallic material having excellent thermal conductivity such as aluminum, and also has a function of a heat radiation member. The lamp body 2 is formed into a substantially cylindrical shape having one end and the other end. A plurality of thermally radiative fins 7 are formed on the outer circumferential surface of the lamp body 2. The thermally radiative fins 7 radially protrude from the outer circumferential surface of the lamp body 2, and outwardly overhang in the radial direction of the lamp body 2 from one end of the lamp body 2 to the other end thereof.

As shown in FIG. 2, the lamp body 2 includes a first concave portion 8, and second concave portion 9. The first concave portion 8 is positioned at one end of the lamp body 2, and is depressed from the one end toward the other end. The second concave portion 9 is positioned at the other end of the lamp body 2, and is depressed from the other end of the lamp body 2 toward the one end. A bottom of the second concave portion 9 forms a flat support surface 9a.

The globe 3 is formed into a substantially hemispherical shape by using, for example, glass or a synthetic resin material having light diffusion properties. The globe 3 includes a spherical cupular portion 3a, and opening portion 10 opposite to the cupular portion 3a. An edge section 3b of the globe 3 defining the opening portion 10 is fitted into the inside of the second concave portion 9 of the lamp body 2. As a result, the globe 3 is coupled to the lamp body 2, and support surface 9a is covered with the globe 3.

As shown in FIG. 2, a cover member 11 having electrical insulation properties is attached to the first concave portion 8 of the lamp body 2. The cover member 11 covers the inner circumferential surface of the first concave portion 8. The cover member 11 includes a cylindrical protrusion portion 12 protruding from the first concave portion 8 toward the outside of the lamp body 2. A space inside the cover member 11 communicates with the support surface 9a of the lamp body 2 through a through-hole 13 penetrating the lamp body 2.

The base 4 is constituted of a metal shell 14 to be screwed into a lamp socket, and insulator 16 including an eyelet terminal 15. The shell 14 is attached to the protrusion portion 12 of the cover member 11. The insulator 16 is attached to the opening end of the protrusion portion 12 to blockade the inner space of the cover member 11.

The lighting device 5 is accommodated inside the cover member 11, and is electrically connected to the base 4. The lighting device 5 is provided with a circuit board 17, and a plurality of circuit components 18 mounted on the circuit board 17.

The inside of the cover member 11 is not always intended for a space for accommodating the lighting device 5. For example, a filling material having electrical insulation properties may be filled into the space inside the cover member 11. As the filling material, for example, a resin material of the silicon system can be used.

A shown in FIG. 2, the light-emitting device 6 is used as a light source of the LED lamp 1. The light-emitting device 6 is attached to the support surface 9a of the lamp body 2, and is covered with the globe 3.

Figure 5:
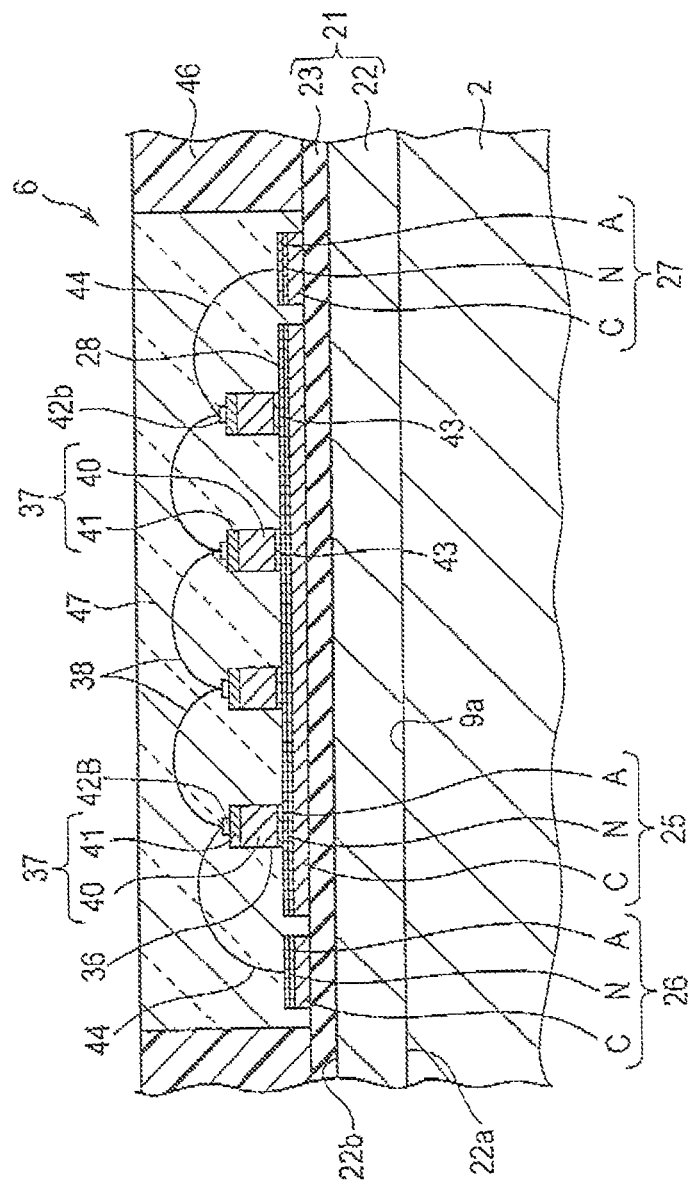
FIG. 5 is a cross-sectional view of the light-emitting device serving as the light source of the LED lamp.

As shown in FIG. 3 and FIG. 5, the light-emitting device 6 is provided with a rectangular module substrate 21. The module substrate 21 has a two-layer structure including a metallic base 22, and insulating layer 23. The metallic base 22 is constituted of aluminum excellent in heat radiation or an alloy thereof. The metallic base 22 includes a first surface 22a, and second surface 22b. The second surface 22b is positioned on the opposite side of the first surface 22a, and constitutes the top surface of the metallic base 22.

The insulating layer 23 is formed on the second surface 22b of the metallic base 22, and entirely covers the second surface 22b. The insulating layer 23 is constituted of epoxy resin in which a phenolic resin or amine-system resin is not used as a hardening agent. In this embodiment, as the hardening agent to be combined with the epoxy resin, an acid anhydride such as hexahydrophthalic anhydride, methyltetrahydrophthalic anhydride or pyromellitic anhydride is used.

Furthermore, a filler such as aluminum oxide is added to the epoxy resin. The addition ratio of the filler to the epoxy resin is 50 wt %. It is advisable to make the insulating layer 23 thinner than the metallic base 22. More specifically, the thickness of the insulating layer 23 is 100 μm or less, for example, 0.08 mm. The total light reflectance of the insulating layer 23 is 50% or less, for example, 35.9%.

The module substrate 21 is fixed to a central part of the support surface 9a of the lamp body 2 by means of a plurality of screws. By this fixation, the first surface 22a of the metallic base 22 is joined to the support surface 9a, and module substrate 21 is thermally connected to the lamp body 2.

As shown in FIGS. 3 to 5, the light reflection layer 25, first power-supply conductor 26, and second power-supply conductor 27 are formed on the insulating layer 23 of the module substrate 21.

The light reflection layer 25 has a rectangular shape having four sides, and is positioned at a central part of the insulating layer 23. The light reflection layer 25 has a three-layer structure formed by combining, for example, three types of metallic layers with each other. More specifically, the light reflection layer 25 is constituted by stacking a copper layer C, nickel layer N, and silver layer A one on top of another. The copper layer C is formed by etching copper foil formed on the insulating layer 23. The nickel layer N is formed on the copper layer. The nickel layer N is formed by subjecting the copper layer C to electroless plating. The silver layer A is formed on the nickel layer N. The silver layer A is formed by subjecting the nickel layer N to electroless plating. The silver layer A constitutes the surface layer of the light reflection layer 25.

Accordingly, the top surface of the light reflection layer 25 is the light-reflecting surface 28 formed of silver. The optical reflectance of the light-reflecting surface 28 is higher than the optical reflectance of the insulating layer 23. The total light reflectance of the light-reflecting surface 28 is, for example, 90.0%.

It is desirable for enhancement of the manufacturability of the light reflection layer 25 to form the silver layer A by electroless plating. More specifically, for example, when the silver layer A is formed by ordinary electroplating, a plating lead is required, thereby making it inevitable that the plating pattern is complicated. Moreover, the plating lead becomes useless after the plating work is completed, and hence specific work of removing the plating lead is required after the plating. Conversely, regarding the electroless plating, it becomes unnecessary to prepare the plating lead, and remove the plating lead, and hence it is possible to easily manufacture the light reflection layer 25.

The structure of the light reflection layer 25 is not limited to the three-layer structure. For example, the light reflection layer 25 may have a single layer of silver or a two-layer structure in which a silver layer is formed on a copper layer serving as an undercoat.

Each of the first power-supply conductor 26 and second power-supply conductor 27 has a belt-like shape extending along a side of the light reflection layer 25, and has an identical size. Each of the first and second power-supply conductors 26 and 27 has, like the light reflection layer 25, a three-layer structure including a copper layer C, nickel layer N, and silver layer A. Accordingly, each of the surface layer of the first power-supply conductor 26, and surface layer of the second power-supply conductor 27 is constituted of silver.

As shown in FIG. 4, the first power-supply conductor 26, and second power-supply conductor 27 are arranged in parallel with each other with an interval held between the conductors 26 and 27 in such a manner that the light reflection layer 25 is interposed between the conductors 26 and 27. The first power-supply conductor 26 and light reflection layer 25 are held in a state where the conductor 26 and layer 25 are electrically insulated from each other by a slit-like first gap 29a. The first gap 29a is provided between the first power-supply conductor 26 and light reflection layer 25. The second power-supply conductor 27 and light reflection layer 25 are held in a state where the conductor 27 and layer 25 are electrically insulated from each other by a slit-like second gap 29b. The second gap 29b is provided between the second power-supply conductor 27 and light reflection layer 25.

Accordingly, areas of the insulating layer 23 corresponding to the first and second gaps 29a and 29b are out of the light reflection layer 25, first power-supply conductor 26, and second power-supply conductor 27, and are exposed at the first and second gaps 29a and 29b.

It is desirable that the surface roughness Ra of the light-reflecting surface 28 of at least the light reflection layer 25 among the light reflection layer 25, first power-supply conductor 26, and second power-supply conductor 27 be 0.2 or less. By specifying the surface roughness Ra of the light-reflecting surface 28, it is possible to prevent the surface area of the light-reflecting surface 28 from increasing due to a large number of minute uneven parts existing on the light-reflecting surface 28.

As shown in FIG. 4, the first power-supply conductor 26 has a conductor pattern 26a extending in a direction in which the pattern 26a is kept away from the light reflection layer 25. A distal end of the conductor pattern 26a constitutes a first terminal section 30. Likewise, the second power-supply conductor 27 has a conductor pattern 27a extending in a direction in which the pattern 27a is kept away from the light reflection layer 25. A distal end of the conductor pattern 27a constitutes a second terminal section 31. The first terminal section 30, and second terminal section 31 are arranged side by side with an interval held between the sections 30 and 31 on the insulating layer 23.

As shown in FIG. 3, a resist layer 32 is formed on the insulating layer 23. The resist layer 32 conceals the surface of the insulating layer 23 other than the light reflection layer 25, first power-supply conductor 26, second power-supply conductor 27, first terminal section 30, and second terminal section 31.

As shown in FIG. 3, a connector 33 is soldered to the first and second terminal sections 30 and 31. The connector 33 is electrically connected to the lighting device 5 through lead wires 34 shown in FIG. 2. The lead wires 34 are guided to the inside of the base 4 through the through-hole 13 of the lamp body 2.

As shown in FIG. 3 and FIG. 5, a plurality of light-emitting diode columns 36 are mounted on the light-reflecting surface 28 of the light reflection layer 25. The light-emitting diode columns 36 linearly extend to connect the first power-supply conductor 26 and second power-supply conductor 27 to each other, and are arranged in parallel with each other with intervals held between the columns 36.

Each of the light-emitting diode columns 36 is provided with a plurality of light-emitting diodes 37, and a plurality of first bonding wires 38. The light-emitting diode 37 is an example of the light-emitting element. The light-emitting diode 37 is constituted of a bare chip including a sapphire substrate 40, and emission layer 41 formed on the sapphire substrate 40. The emission layer 41 is constituted of, for example, a nitride-system compound semiconductor configured to emit blue light. The light-emitting diode 37 has a shape of a rectangular parallelepiped in which, for example, a length of the long side is 0.5 mm, and length of the short side is 0.25 mm.

Furthermore, the light-emitting diode 37 is that of the single side electrode arrangement type in which an anode electrode 42a and cathode electrode 42b are provided on the emission layer 41. The electrodes 42a and 42b are arranged in the longitudinal direction of the light-emitting diode 37 with an interval held between the electrodes 42a and 42b.

Each of the light-emitting diodes 37 is joined to the light-reflecting layer 28 with an adhesive 43 having translucency. Furthermore, the light-emitting diodes 37 are linearly arranged at intervals for each light-emitting diode column 36. As a result, the plurality of light-emitting diodes 37 are regularly arranged in a matrix form on the light-reflecting surface 28.

In other words, the light-reflecting surface 28 has a size in which all the light-emitting diodes 37 can be arranged. Accordingly, the light-reflecting surface 28 is continuous without breaking off at any position between light-emitting diodes 37 adjacent to each other. Thus, the insulating layer 23 under the light-reflecting surface 28 is never exposed at any position between light-emitting diodes 37 adjacent to each other.

The first bonding wires 38 electrically connect light-emitting diodes 37 adjacent to each other in the direction in which the light-emitting diode columns 36 extend in series. More specifically, the first bonding wires 38 bridge adjacent light-emitting diodes in such a manner that electrodes 42a and 42b of adjacent light-emitting diodes 37 different from each other in polarity are electrically connected to each other.

As shown in FIG. 3, the plurality of light-emitting diode columns 36 are electrically connected to the first power-supply conductor 26 and second power-supply conductor 27 through a plurality of second bonding wires 44. More specifically, one light-emitting diode 37 positioned at one end of each light-emitting diode column 36 is adjacent to the first power-supply conductor 26 serving as the positive electrode. The electrode 42b of the light-emitting diode 37 is electrically connected to the first power-supply conductor 26 through the second bonding wire 44.

One light-emitting diode 37 positioned at the other end of each light-emitting diode column 36 is adjacent to the second power-supply conductor 27 serving as the negative electrode. The electrode 42a of the light-emitting diode 37 is electrically connected to the second power-supply conductor 27 through the second bonding wire 44. Accordingly, the plurality of light-emitting diode columns 36 are electrically connected to the first and second power-supply conductors 26 and 27 in parallel with each other.

In this embodiment, gold thin wires are used as the first bonding wires 38 and second bonding wires 44.

The lighting device 5 supplies electric currents to the plurality of light-emitting diode columns 36 through the first and second power-supply conductors 26 and 27. Thereby, the light-emitting diodes 37 of the light-emitting diode columns 36 emit light all at once. The light-emitting diode columns 36 are connected to the first and second power-supply conductors 26 and 27 in parallel with each other, and hence even when light emission of one light-emitting diode column 36 stops for one reason or another, the remaining light-emitting diode columns 36 continue to emit light.

The light-emitting diode 37 generates heat during light emission. The heat generated from the light-emitting diode 37 is conducted to the light reflection layer 25 through the adhesive 43. At this time, by using gold thin wires as the second bonding wires 44, it is made hard for the heat from the light-emitting diode 37 diffused into the light reflection layer 25 to be easily conducted to the first and second power-supply conductors 26 and 27. As a result, it is possible to equalize the temperature distribution of the light reflection layer 25, and reduce the differences between temperatures of the plurality of light-emitting diodes 37 positioned on the light reflection layer 25 to small values.

As shown in FIG. 3, and FIG. 5, a rectangular frame body 46 is joined to the insulating layer 23 of the module substrate 21. The frame body 46 is constituted of an insulating material such as a synthetic resin, and collectively surrounds the light reflection layer 25, and first and second power-supply conductors 26 and 27. In other words, the light-emitting diode columns 36, and second bonding wires 44 are accommodated in the rectangular area surrounded by the frame body 46.

Furthermore, the frame body 46 is slightly separate from the outer circumferential edge of the first power-supply conductor 26, and outer circumferential edge of the second power-supply conductor 27. Accordingly, part of the area of the insulating layer 23 is exposed at a part surrounded by the frame body 46.

A sealing member 47 is filled into the part surrounded by the frame body 46. The sealing member 47 is constituted of a resin material having gas permeability and translucency. In this embodiment, as the resin material, a transparent silicon resin is used. The silicon resin is poured into the part surrounded by the frame body 46 in a liquid state. The poured silicon resin is hardened by heating and drying. Accordingly, the area of the sealing member 47 is defined by the frame body 46. The hardened sealing member 47 is formed on the insulating layer 23 of the module substrate 21, and seals the light reflection layer 25, first power-supply conductor 26, second power-supply conductor 27, light-emitting diode columns 36, and second bonding wires 44 on the insulating layer 23.

According to this embodiment, the sealing member 47 contains therein a fluorescent material. The fluorescent material is uniformly dispersed in the sealing member 47. As the fluorescent material, a yellow fluorescent material configured to emit yellow light when excited by blue light emitted from the light-emitting diode 37 is used.

The fluorescent material to be mixed into the sealing member 47 is not limited to the yellow fluorescent material. For example, in order to improve the color rendering properties of light emitted from the light-emitting diode 37, a red fluorescent material configured to emit red light when excited by blue light or green fluorescent material configured to emit green light when excited by blue light may be added to the sealing member 47.

In the LED lamp 1 according to this embodiment, a voltage is applied from the lighting device 5 to the light-emitting device 6. As a result, the light-emitting diodes 37 on the light reflection layer 25 emit light all at once. The blue light emitted from the light-emitting diodes 37 is made incident on the sealing member 47. Part of the blue light made incident on the sealing member 47 is absorbed by the yellow fluorescent material. The remaining part of the blue light is transmitted through the sealing member 47 without coming into contact with the yellow fluorescent material.

The yellow fluorescent material which has absorbed the blue light is excited and emits yellow light. The yellow light is transmitted through the sealing member 47. As a result, the yellow light and blue light are mixed with each other in the sealing member 47 to form white light. The white light is radiated from the sealing member 47 toward the globe 3. Thus, the sealing member 47 surrounded by the frame body 46 functions as a light-emitting section shining in a surface form.

The light travelling from the light-emitting diode 37 toward the module substrate 21 is reflected from the light-reflecting surface 28 of the light reflection layer 25, and first and second power-supply conductors 26 and 27 to travel toward the globe 3. As a result, much of the light emitted from the light-emitting diodes 37 is transmitted through the globe 3 to be utilized for the illumination purpose.

In this embodiment, although the ratio of the footprint of the light reflection layer 25 to the sealing area of the sealing member 47 is not particularly specified, the ratio of 80% or more of the footprint of the light reflection layer 25 is desirable for the enhancement of the lumen maintenance factor. The lumen maintenance factor implies a ratio of the luminous flux obtained at the initial light-emission time when a light-emitting device 6 is made to emit light for the first time to the luminous flux obtained when the continuous light-emission time of 1000 hours has elapsed from the initial light-emission time. The continuous light-emission time of 1000 hours corresponds to an operating time of 40000 hours when the light-emitting device 6 is actually used as the light source of the LED lamp 1.

By making the ratio of the footprint of the light reflection layer 25 80% or more, the relative luminous flux of 90% or more is secured. Furthermore, even after an elapse of 40000 hours in the state where the light-emitting device 6 is actually used as the light source of the LED lamp 1, it is possible to maintain the luminous flux of approximately 80% of the luminous flux at the initial light-emission time. Accordingly, it is possible to obtain a high-quality light-emitting device 6 with high light output.

The heat generated from the plurality of light-emitting diodes 37 at the light-emission time of the light-emitting device 6 is conducted to the light reflection layer 25 of the module substrate 21. The light reflection layer 25 functions as a heat spreader configured to spread the heat conducted from the light-emitting diodes 37. The heat from the light-emitting diodes 37 diffused into the light reflection layer 25 is conducted to the metallic base 22 through the insulating layer 23, and is then conducted from the metallic base 22 to the lamp body 2 through the support surface 9a. The heat conducted to the lamp body 2 is radiated from the thermally radiative fins 7 to the outside of the LED lamp 1.

As a result, it is possible to positively make the heat from the light-emitting diodes 37 escape from the module substrate 21 to the lamp body 2. Accordingly, it is possible to enhance the heat radiation capability, and maintain the luminous efficacy of the light-emitting diodes 37 at an excellent level.

According to the light-emitting device 6 associated with this embodiment, all the light-emitting diodes 37 are mounted on one light reflection layer 25 formed on the insulating layer 23. Accordingly, the ratio of an area of the insulating layer 23 exposed in the area filled with the sealing member 47 is smaller than the configuration in which a plurality of light reflection layers of a number corresponding to the number of light-emitting diodes 37 are arranged on the insulating layer 23, and the light-emitting diodes 37 are individually mounted on these light reflection layers. In other words, the area of the light reflection layer 25 exposed in the area filled with the sealing member 47 becomes far greater than the area of the insulating layer 23 exposed in the area filled with the sealing member 47.

As a result, the light radiated from the light-emitting diodes 37 toward the module substrate 21 is reflected from the silver light reflection layer 25 in the direction in which the light is to be efficiently extracted. Accordingly, it becomes hard for the light travelling from the light-emitting diode 37 toward the module substrate 21 to be affected by the insulating layer 23 having low light reflective performance. This advantage is made more secure by setting the ratio of the footprint of the light reflection layer 25 to the sealing area of the sealing member 47 at 80% or more.

On the other hand, part of the insulating layer 23 made of the epoxy resin is exposed at the first and second gaps 29a and 29b, at a part between the frame body 46 and first power-supply conductor 26, and at a part between the frame body 46 and second power-supply conductor 27, and is covered with the sealing member 47. In other words, part of the insulating layer 23 made of the epoxy resin is out of the light reflection layer 25, and is covered with the sealing member 47 having gas permeability. Accordingly, it is inevitable that part of the light radiated from the light-emitting diodes 37 is shined into the insulating layer 23.

When the epoxy resin constituting the insulating layer 23 receives light, part of the resin components forming the skeleton are gradually deteriorated, and emit gaseous decomposed matter. The epoxy resin of an epoxy-acid anhydride system used in this embodiment is no exception to the above rule, and the resin components forming the skeleton are decomposed by light to emit gaseous decomposed matter.

However, the epoxy resin of an epoxy-acid anhydride system does not contain the phenolic resin or the amine-system resin functioning as a hardening agent. Accordingly, even when the resin components of the epoxy resin of an epoxy-acid anhydride system are decomposed by the light from the light-emitting diodes 37, the gasified decomposed matter and light reflection layer 25 made of silver do not react with each other or even if they react each other, the degree of reaction is negligible.

Accordingly, it is possible to prevent the light-reflecting surface 28 of the light reflection layer 25 from being discolored dark, which lowers the optical reflectance of the light-reflecting surface 28. As a result, the light emitting device 6 can maintain the expected light output for a long time.

The insulating layer 23 of the module substrate 21 is not limited to the configuration using the epoxy resin. For example, in place of the insulating layer 23 made of the epoxy resin, an insulating layer 23 made of a non-epoxy resin may also be used. The non-epoxy resin implies one of a polyimide resin, polyethylene terephthalate resin, and fluororesin.

Any one of the polyimide resin, polyethylene terephthalate resin, and fluororesin does not contain the phenolic resin or the amine-system resin functioning as a hardening agent. Accordingly, even when the resin components constituting the insulating layer 23 are decomposed by the light from the light-emitting diodes 37, the gasified decomposed matter and light reflection layer 25 made of silver do not react with each other or even if they react each other, the degree of reaction is negligibly insignificant.

Accordingly, it is possible to prevent the light-reflecting surface 28 of the light reflection layer 25 from being discolored dark, which lowers the optical reflectance of the light-reflecting surface 28. As a result, the light emitting device 6 can maintain the expected light output for a long time.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A light-emitting device comprising:
a substrate including a metallic base and an insulating layer formed on the base, the insulating layer comprising an epoxy resin using an acid anhydride as a hardening agent or one of a polyimide resin, a polyethylene terephthalate resin, and a fluororesin;
a light reflection layer formed on the insulating layer, the light reflection layer including a metallic light-reflecting surface higher in optical reflectance than the insulating layer;
a plurality of light-emitting elements mounted on the light-reflecting surface; and
a sealing member comprising a material having gas permeability and translucency, the sealing member being formed on the insulating layer to seal the light reflection layer and the light-emitting elements;
wherein a ratio of the light-reflecting surface in an area sealed by the sealing member to the area is greater than a ratio of the insulating layer exposed in the area to the area.

2. The light-emitting device of claim 1, wherein the insulating layer includes an area out of the light reflection layer, and the area is covered with the sealing member.

3. An illumination device comprising a body, and a light-emitting device supported on the body, wherein
the light-emitting device comprises:
a substrate including a metallic base and an insulating layer formed on the base, the insulating layer comprising an epoxy resin using an acid anhydride as a hardening agent or one of a polyimide resin, a polyethylene terephthalate resin, and a fluororesin;
a light reflection layer formed on the insulating layer, the light reflection layer including a metallic light-reflecting surface higher in optical reflectance than the insulating layer;
a plurality of light-emitting elements mounted on the light-reflecting surface; and
a sealing member comprising a material having gas permeability and translucency, the sealing member being formed on the insulating layer to seal the light reflection layer and the light-emitting elements
wherein a ratio of the light-reflecting surface exposed in an area sealed by the sealing member to the area is greater than a ratio of the insulating layer exposed in the area to the area.

4. The illumination device of claim 3, further comprising a lighting device provided on the body, and configured to light the light-emitting device.

* * * * *